(12) United States Patent
Boettiger et al.

(10) Patent No.: US 10,608,029 B2
(45) Date of Patent: *Mar. 31, 2020

(54) IMAGE SENSORS WITH COLOR FILTER VARIATIONS

(71) Applicant: SEMICONDUCTOR COMPONENTS INDUSTRIES, LLC, Phoenix, AZ (US)

(72) Inventors: Ulrich Boettiger, Garden City, ID (US); Swarnal Borthakur, Boise, ID (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 16/217,739

(22) Filed: Dec. 12, 2018

(65) Prior Publication Data

US 2019/0123084 A1    Apr. 25, 2019

Related U.S. Application Data

(63) Continuation of application No. 15/676,664, filed on Aug. 14, 2017, now Pat. No. 10,204,946.

(51) Int. Cl.
*H01L 31/0232* (2014.01)
*H01L 27/146* (2006.01)

(52) U.S. Cl.
CPC .... *H01L 27/14621* (2013.01); *H01L 27/1462* (2013.01); *H01L 27/14645* (2013.01); *H01L 27/14627* (2013.01)

(58) Field of Classification Search
USPC ......... 257/432, 252–254, 257–258, E31.127, 257/294, 40, E23.062, E23.114, E27.156, 257/E27.159, E31.001, E31.117, E31.119, 257/291, 434; 438/72, 70, 155, 20, 48, 438/64, 66, 710

See application file for complete search history.

(56) References Cited

U.S. PATENT DOCUMENTS

| | | | |
|---|---|---|---|
| 10,204,946 B1* | 2/2019 | Boettiger | H01L 27/14645 |
| 2012/0019695 A1 | 1/2012 | Qian et al. | |
| 2013/0200251 A1 | 8/2013 | Velichko | |
| 2014/0339606 A1 | 11/2014 | Lin et al. | |
| 2015/0048467 A1 | 2/2015 | Weng et al. | |
| 2015/0350583 A1 | 12/2015 | Mauritzson et al. | |
| 2016/0372507 A1 | 12/2016 | Yang et al. | |
| 2017/0127024 A1* | 5/2017 | Yokogawa | H01L 27/14625 |
| 2017/0133420 A1* | 5/2017 | Silsby | H01L 27/14621 |

* cited by examiner

*Primary Examiner* — Niki H Nguyen
(74) *Attorney, Agent, or Firm* — Treyz Law Group, P.C.; Joseph F. Guihan

(57) ABSTRACT

Color filters may affect imaging performance attributes such as low light sensitivity, color accuracy, and modulation transfer function (MTF). In an image pixel array, these factors are influenced by both the spectral absorption and pattern of the color filter elements. Different portions of an image sensor may prioritize different imaging performance attributes. Accordingly, in certain applications it may be beneficial for color filter characteristics to vary across an image sensor. Different color filters of the same color may have different structures to optimize imaging performance across the image sensor.

10 Claims, 16 Drawing Sheets

IMAGE SENSORS WITH COLOR FILTER VARIATIONS

This application is a continuation of application Ser. No. 15/676,664, filed Aug. 14, 2017, which is hereby incorporated by reference herein in its entirety.

BACKGROUND

This relates generally to image sensors and, more particularly, to image sensors having color filters.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Each pixel receives incident photons (light) and converts the photons into electrical signals. Column circuitry is coupled to each pixel column for reading out pixel signals from the image pixels. Image sensors are sometimes designed to provide images to electronic devices using a Joint Photographic Experts Group (JPEG) format.

Conventional image sensors sometimes include a color filter element above each pixel. In one typical arrangement, color filter elements may be arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. Conventional image sensors have a color filter pattern such as the Bayer mosaic pattern that repeats across the array without variation in pattern or wavelength absorption. This may limit image sensor performance when a variable response is desired.

It would therefore be desirable to provide improved color filter arrays for image sensors.

DETAILED DESCRIPTION

Figure 1:
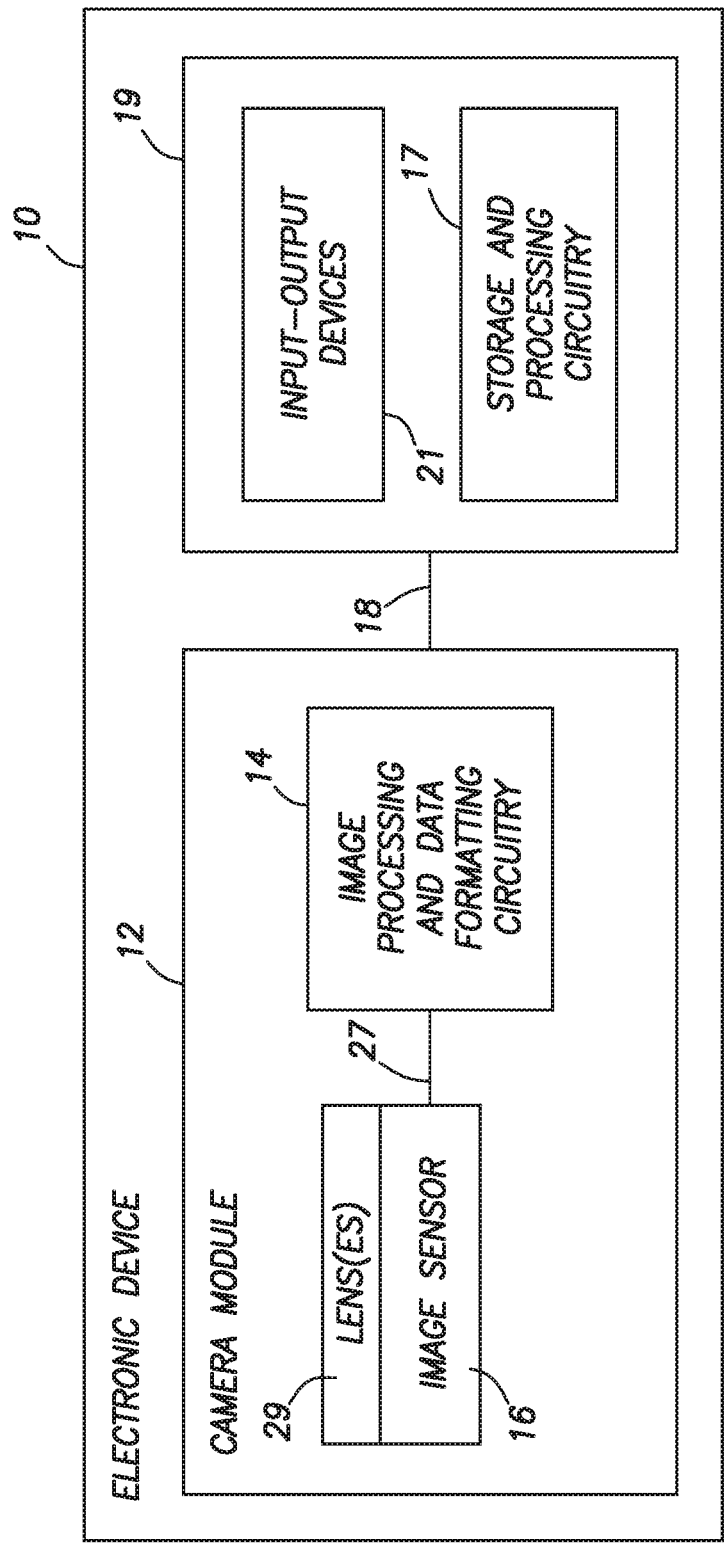
FIG. 1 is a schematic diagram of an illustrative electronic device that may include an image sensor in accordance with an embodiment of the present invention.

Embodiments of the present invention relate to image sensors with pixels that include color filter arrays with variations across the array. An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 16 and one or more lenses 29. During operation, lenses 29 (sometimes referred to as optics 29) focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). An image sensor may include any desired additional circuitry. As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 16 may be provided to image processing and data formatting circuitry 14 via path 27. Image processing and data formatting circuitry 14 may be used to perform image processing functions such as automatic focusing functions, depth sensing, data formatting, adjusting white balance and exposure, implementing video image stabilization, face detection, etc. For example, during automatic focusing operations, image processing and data formatting circuitry 14 may process data gathered by phase detection pixels in image sensor 16 to determine the magnitude and direction of lens movement (e.g., movement of lens 29) needed to bring an object of interest into focus.

Image processing and data formatting circuitry 14 may also be used to compress raw camera image files if desired (e.g., to Joint Photographic Experts Group or JPEG format). In a typical arrangement, which is sometimes referred to as a system on chip (SOC) arrangement, camera sensor 16 and image processing and data formatting circuitry 14 are implemented on a common integrated circuit. The use of a single integrated circuit to implement camera sensor 16 and image processing and data formatting circuitry 14 can help to reduce costs. This is, however, merely illustrative. If desired, camera sensor 14 and image processing and data formatting circuitry 14 may be implemented using separate integrated circuits. If desired, camera sensor 16 and image processing circuitry 14 may be formed on separate semiconductor substrates. For example, camera sensor 16 and image processing circuitry 14 may be formed on separate substrates that have been stacked.

Camera module 12 may convey acquired image data to host subsystems 19 over path 18 (e.g., image processing and data formatting circuitry 14 may convey image data to subsystems 19). Electronic device 10 typically provides a user with numerous high-level functions. In a computer or advanced cellular telephone, for example, a user may be provided with the ability to run user applications. To implement these functions, host subsystem 19 of electronic device 10 may include storage and processing circuitry 17 and input-output devices 21 such as keypads, input-output ports, joysticks, and displays. Storage and processing circuitry 17 may include volatile and nonvolatile memory (e.g., random-access memory, flash memory, hard drives, solid state drives, etc.). Storage and processing circuitry 17 may also include microprocessors, microcontrollers, digital signal processors, application specific integrated circuits, or other processing circuits.

Figure 2:
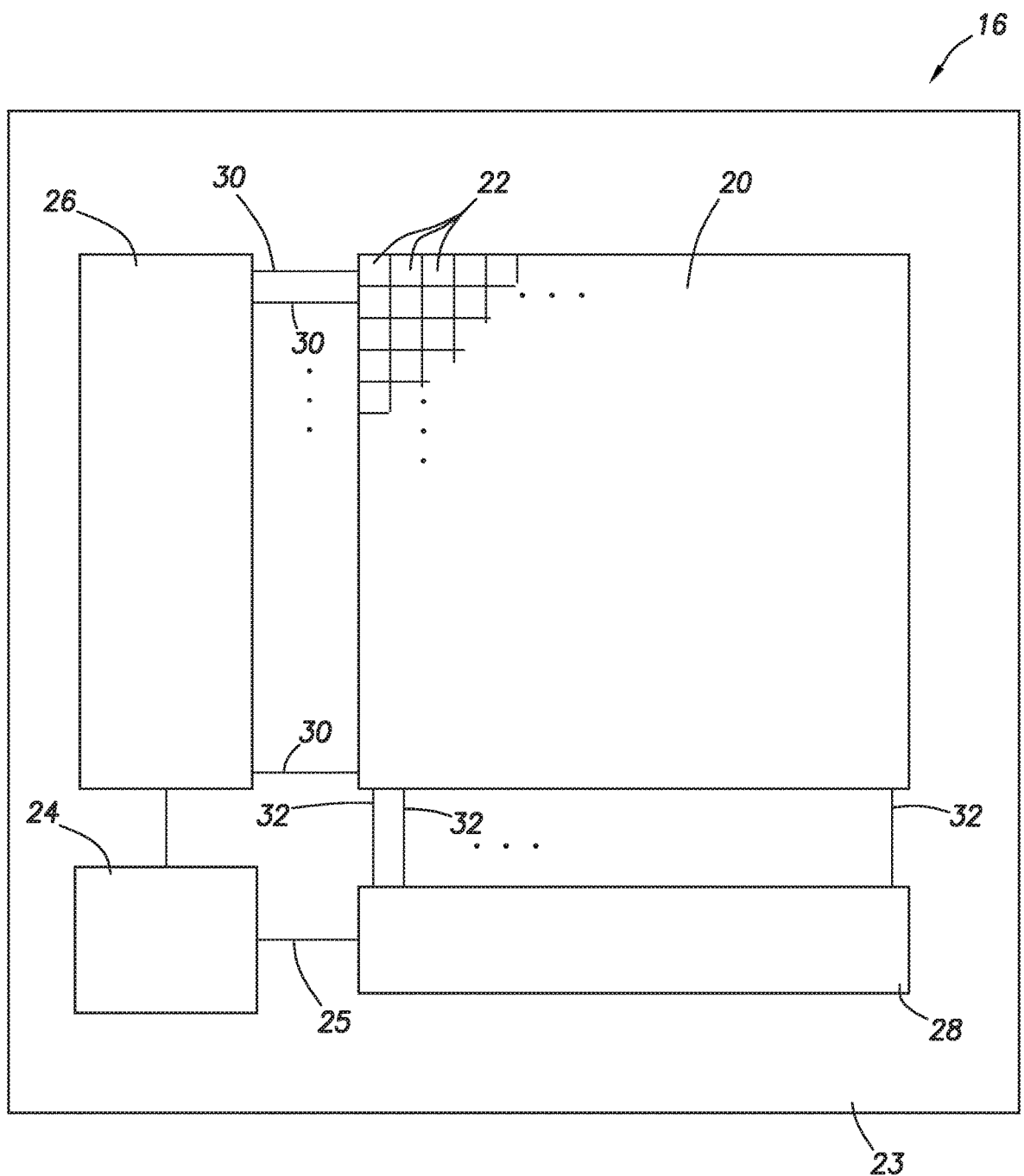
FIG. 2 is a diagram of an illustrative pixel array and associated readout circuitry for reading out image signals from the pixel array in accordance with an embodiment of the present invention.

As shown in FIG. 2, image sensor 16 may include pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Pixel array 20, control and processing circuitry 24, row control circuitry 26, and image readout circuitry 28 may be formed on a substrate 23. If desired, some or all of the components of image sensor 16 may instead be formed on substrates other than substrate 23, which may be connected to substrate 23, for instance, through wire bonding or flip-chip bonding.

Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 over path 25 for pixels in one or more pixel columns.

Image pixel array 20 may be covered by a color filter array. The color filter array may include a plurality of color filter elements, each of which covers a respective pixel. There are different factors to be optimized when designing a color filter element. For example, the color filter may affect imaging performance attributes such as low light sensitivity, color accuracy, and modulation transfer function (MTF). In an image pixel array, these factors are influenced by both the spectral absorption and pattern of the overlying color filter elements.

In some applications, the desired attributes of the sensor may differ in different parts of the sensor. For example, image sensors may be used in a vehicle safety system. Images captured by vehicle safety systems may be used by the vehicle safety system to determine environmental conditions surrounding the vehicle. As examples, the image sensor may be used in a parking assistance system, an automatic or semi-automatic cruise control system, an auto-braking system, a collision avoidance system, a pedestrian detection system, a lane keeping system (sometimes referred to as a lane drift avoidance system), etc. In these types of applications, the image sensor may be optimized for the types of input images that are expected. For example, image sensors in automotive systems may typically capture the sky in the upper portion of the image sensor. Pedestrians may most often be present in the left or right portions of the image sensor. Therefore, the color filter array can be optimized for each zone of the image sensor.

Figure 3A:
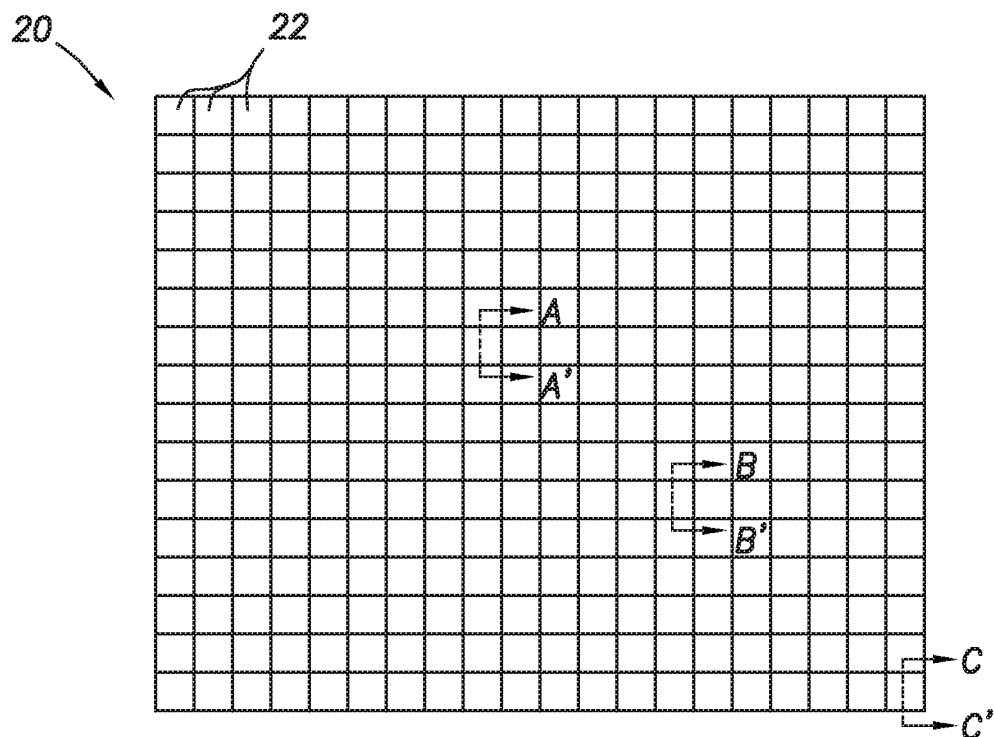
FIG. 3A is a top view of an illustrative image sensor with different color filter properties in different portions of the array in accordance with an embodiment of the present invention.

To optimize image performance across the entire image pixel array, different color filter elements in the image pixel array may have different properties. FIG. 3A is a top view of an illustrative image pixel array with different color filter properties in different portions of the array. In one illustrative example (as shown in FIGS. 3A-3D), the properties of the color filter elements may vary based on a distance from the center of the array.

Figure 3B:
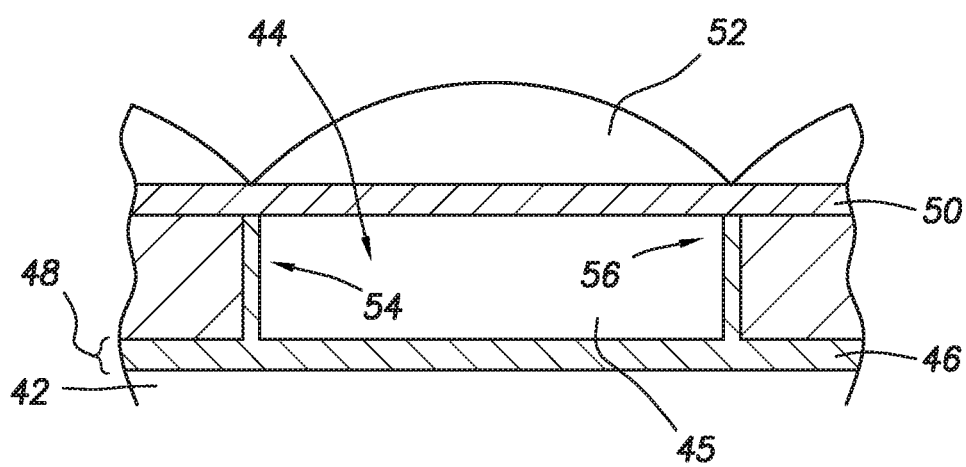
FIGS. 3B-3D are cross-sectional side views of different color filter elements in the image sensor of FIG. 3A with different amounts of transparent filler formed from a passivation layer in the color filter elements in accordance with an embodiment of the present invention.
Figure 3C:
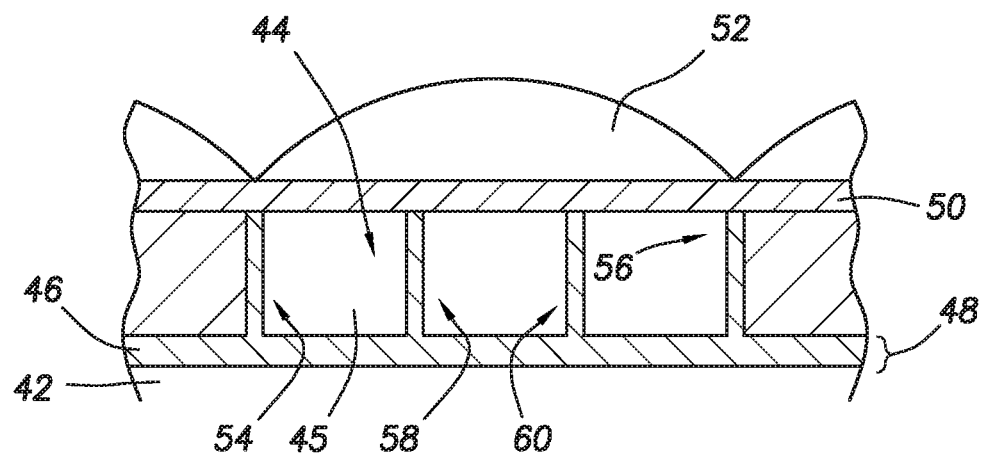
Figure 3D:
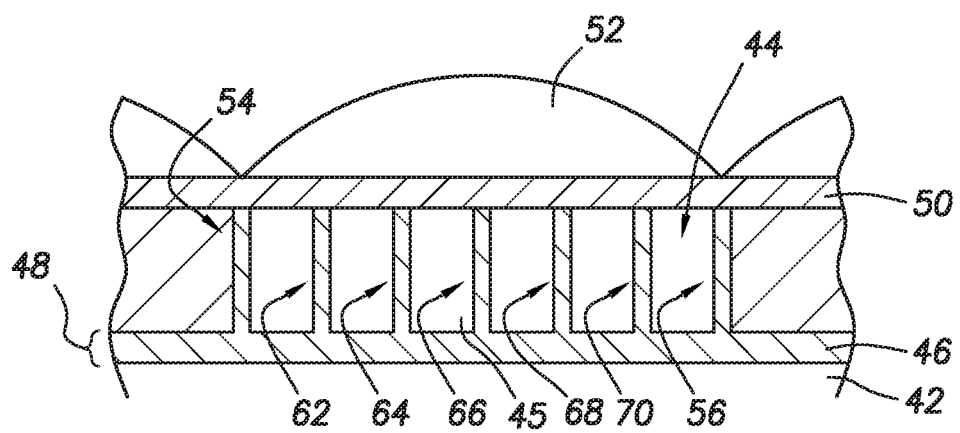

FIG. 3B is a cross-sectional side view along line AA' of FIG. 3A, FIG. 3C is a cross-sectional side view along line BB' of FIG. 3A, and FIG. 3D is a cross-sectional side view along line CC' of FIG. 3A. As shown in FIG. 3B, color filter elements may be formed on a substrate 42. Substrate 42 may include photosensitive areas such as photodiodes for each pixel. A respective color filter element 44 may cover each photosensitive area. A passivation layer 46 may be interposed between the color filter elements and the substrate. The passivation layer may be formed from any desired material such as a dielectric material and may consist of multiple layers (e.g., HfOx, $Ta_2O_5$, $Al_2O_3$, $SiO_2$, $Si_3N_4$, etc.). The passivation layer may be transparent and may be dielectric. Additionally, a planarization layer 50 (sometimes referred to as a planar layer) may be formed over color filter elements 44. Planarization layer 50 may be interposed between color filter elements 44 and microlenses 52. Planarization layer 50 may be formed from any desired material (i.e., an organic material). Planarization layer 50 may be formed from dielectric material. Planarization layer 50 and passivation layer 46 may sometimes be referred to as dielectric layers.

In FIG. 3B, the color filter element 44 may be contained within material from passivation layer 46. This arrangement may sometimes be referred to as a color filter in a box (CIAB) arrangement. As shown in FIG. 3B, passivation layer 46 has a first portion 48 that extends across the entire array. Additionally, passivation layer 46 includes portions 54 and 56 that extend from an upper surface of portion 48 of passivation layer 46 to a lower surface of planarization layer 50. Portions 54 and 56 form sidewalls that contain color filter element 44.

In FIG. 3B, color filter element 44 is formed from color filtering material 45 that is uninterrupted between portions 54 and 56 of passivation layer 46. However, color filter elements in different portions of array 20 may have a different structure. FIG. 3C shows the cross-sectional side view of a pixel that is further from the center of the array than the color filter element of FIG. 3B. This color filter element may include additional transparent portions within the color filter element to selectively alter the response to incident light of the color filter element. The additional transparent portions may be transparent to a wider range of incident light than the surrounding color filter material.

As shown in FIG. 3C, color filter element 44 has portions 54 and 56 of passivation layer 46 to separate color filter element 44 from adjacent color filter elements (similar to as shown in FIG. 3B). However, color filter element 44 may also include additional transparent portions formed by additional portions 58 and 60 of passivation layer 46. Portions 58 and 60 of passivation layer 46 extend from an upper surface of portion 48 of passivation layer 46 to a lower surface of planarization layer 50.

Color filter element 44 may be a green filter, red filter, blue filter, yellow filter, cyan filter, magenta filter, clear filter, infrared filter, or other type of filter. As an example, a green filter passes green light (e.g., light with wavelengths from 495 nm to 570 nm) and reflects and/or absorbs light out of that range (e.g., the green filter mainly absorbs red light and blue light). In FIG. 3B, the color filtering material 45 (i.e., the material that filters green light) of color filter 44 extends across the entire pixel. In FIG. 3C, however, the color filtering material of color filter 44 is interrupted by portions 58 and 60 of passivation layer 46. The portions 58 and 60 of passivation layer 46 do not pass only green light. For example, portions 58 and 68 of passivation layer 46 may pass all visible light, all infrared light, and/or light of other wavelengths. Therefore, the response of the pixel to incident light with the color filter element in FIG. 3C will be different than the pixel with the color filter element in FIG. 3B.

FIG. 3D shows the cross-sectional side view of a pixel that is even further from the center of the array than the color filter element of FIG. 3C. This color filter element may include additional transparent portions within the color filter element to further alter the response to incident light of the color filter element. As shown in FIG. 3D, color filter element 44 has portions 54 and 56 of passivation layer 46 to separate color filter element 44 from adjacent color filter elements (similar to as shown in FIGS. 3B and 3C). However, color filter element 44 may also include additional transparent portions formed by additional portions 62, 64, 66, 68, and 70 of passivation layer 46. Portions 62, 64, 66, 68, and 70 of passivation layer 46 extend from an upper surface of portion 48 of passivation layer 46 to a lower surface of planarization layer 50. The portions 62, 64, 66, 68, and 70 of passivation layer 46 have different transmittance of incident light than the surrounding color filtering material 45. Therefore, the response of the pixel with the color filter element in FIG. 3D will be different than the pixel with the color filter element in FIG. 3C.

In FIGS. 3C and 3D, additional portions of passivation layers are included in the color filter element with similar structure to sidewalls 54 and 56 of FIG. 3B. This allows the additional transparent portions (i.e., 58 and 60 in FIG. 3C and 62, 64, 66, 68, and 70 in FIG. 3D) to be formed in the same manufacturing step as sidewalls 54 and 56. It should be noted that chemical mechanical planarization may be performed to ensure that the color filters of FIGS. 3B, 3C, and/or 3D have a planar upper surface.

In FIGS. 3A-3D, an embodiment is shown where every pixel is contained within dielectric structures (i.e., CIAB structures including the same material as passivation layer 46). However, this example is merely illustrative.

Figure 4A:
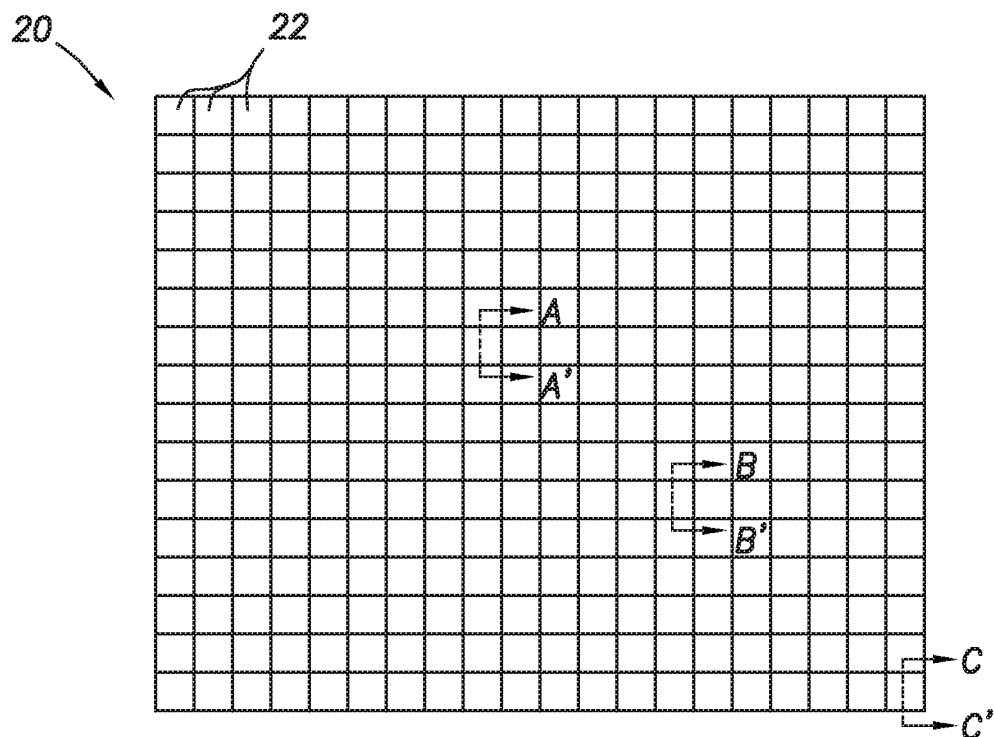
FIG. 4A is a top view of an illustrative image sensor with different color filter properties in different portions of the array in accordance with an embodiment of the present invention.
Figure 4B:
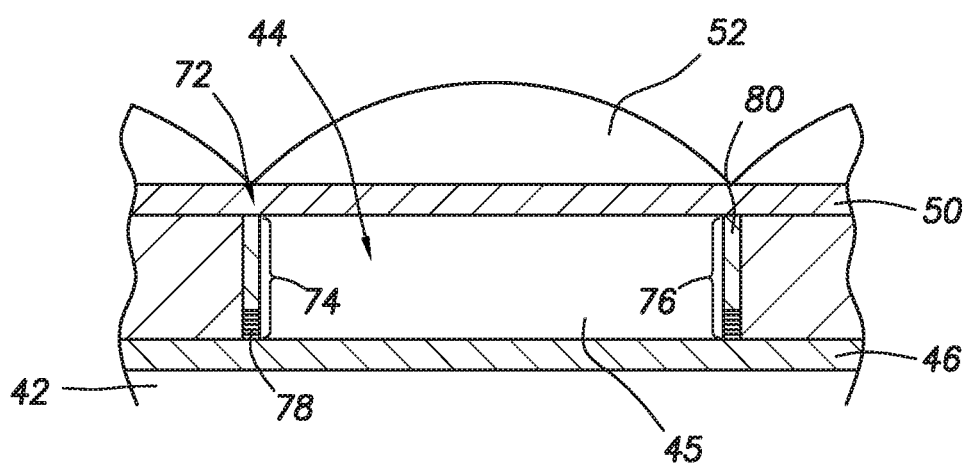
FIGS. 4B-4D are cross-sectional side views of different color filter elements in the image sensor of FIG. 4A with varying amounts of a composite pattern included in the color filter elements in accordance with an embodiment of the present invention.
Figure 4C:
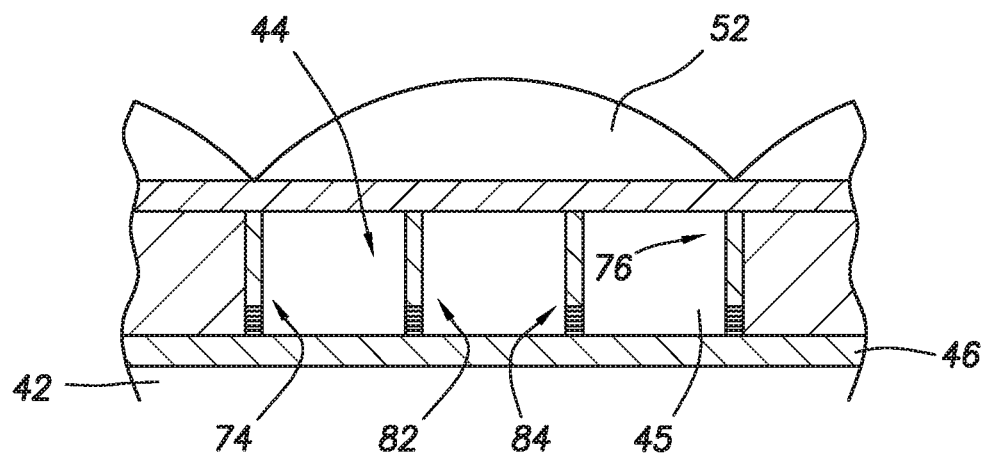
Figure 4D:
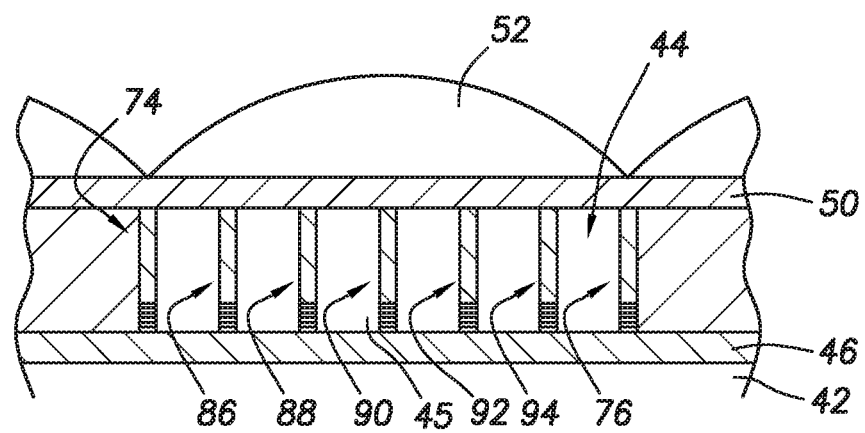

FIGS. 4A-4D show an illustrative embodiment where a composite grid is used to selectively alter color filter characteristics across the array. FIG. 4A is a top view of an illustrative image pixel array with different color filter properties in different portions of the array. FIG. 4B is a cross-sectional side view along line AA' of FIG. 4A, FIG. 4C is a cross-sectional side view along line BB' of FIG. 4A, and FIG. 4D is a cross-sectional side view along line CC' of FIG. 4A. Similar to as discussed in connection with FIGS. 3B-3D, color filter elements may be formed on a substrate 42 that includes photosensitive areas. A respective color filter element 44 may cover each pixel, a passivation layer 46 may be interposed between the color filter elements and the substrate, a planarization layer 50 may be formed over color filter elements 44, and a microlens 52 may be formed over each pixel.

As shown in FIG. 4B, the color filter material 45 of color filter element 44 may be contained within a composite grid 72 formed by composite grid portions 74 and 76. Each composite grid portion may include metal 78 formed below dielectric 80. Metal 78 may be tungsten or any other desired metal. Dielectric 80 may be formed from the same material as passivation layer 46, the same material as planarization layer 50, or any other desired dielectric material. Composite grid 72 may be referred to as a composite because it includes both the metal and dielectric portions. The composite grid portions may have any desired ratio of metal to dielectric. If desired, a bias voltage may be applied to metal 78 of the composite grid at one or more locations at any time during image acquisition or readout.

In FIG. 4B, color filter element 44 is formed from color filtering material 45 that is uninterrupted between portions 74 and 76 of composite grid 72. However, color filter elements in different portions of array 20 may have a different structure. FIG. 4C shows the cross-sectional side view of a pixel that is further from the center of the array than the color filter element of FIG. 4B. This color filter element may include additional composite grid portions within the color filter element to selectively alter the response to incident light of the color filter element. The additional composite grid portions may be transparent to a wider range of incident light than the surrounding color filter material and/or may be opaque to incident light.

As shown in FIG. 4C, color filter element 44 has portions 74 and 76 of composite grid 72 to separate color filter element 44 from adjacent color filter elements (similar to as shown in FIG. 4B). However, color filter element 44 may also include additional composite grid portions formed by composite grid portions 82 and 84 of composite grid 72. Portions 74, 76, 82, and 84 of composite grid 72 extend from an upper surface of passivation layer 46 to a lower surface of planarization layer 50.

In FIG. 4B, the color filtering material 45 (i.e., the material that filters light of a particular color) of color filter 44 extends across the entire pixel. In FIG. 4C, however, the color filter material of color filter 44 is interrupted by portions 82 and 84 of composite grid 72. The portions 82 and 84 of composite grid 72 do not pass only light of the particular color (like color filter material 45). For example, portions 82 and 84 of composite grid 72 may pass all visible light, all infrared light, and/or light at other wavelengths. The metal portions of composite grid 72 may be at least partially opaque to incident light. Therefore, the response of the pixel to incident light with the color filter element in FIG. 4C will be different than the pixel with the color filter element in FIG. 4B.

FIG. 4D shows the cross-sectional side view of a pixel that is even further from the center of the array than the color filter element of FIG. 4C. This color filter element may include additional composite grid portions within the color filter element to further alter the response to incident light of the color filter element. As shown in FIG. 4D, color filter element 44 has portions 74 and 76 of composite grid 72 to separate color filter element 44 from adjacent color filter elements (similar to as shown in FIGS. 4B and 4C). However, color filter element 44 may also include additional composite grid portions 86, 88, 90, 92, and 94. Portions 86, 88, 90, 92, and 94 of composite grid 72 extend from an upper surface of passivation layer 46 to a lower surface of planarization layer 50. The portions 86, 88, 90, 92, and 94 of passivation layer do not have the same transmittance of incident light as color filtering material 45. Therefore, the response of the pixel with the color filter element in FIG. 4D will be different than the pixel with the color filter element in FIG. 4C.

In FIGS. 4C and 4D, additional portions of the composite grid are included with similar structure to composite grid portions 74 and 76 of FIG. 4B. This allows the additional composite grid portions (i.e., 82 and 84 in FIG. 4C and 86, 88, 90, 92, and 94 in FIG. 4D) to be formed in the same manufacturing step as composite grid portions 74 and 76. It should be noted that chemical mechanical planarization may be performed to ensure that the color filters of FIGS. 4B, 4C, and/or 4D have a planar upper surface.

Figure 5A:
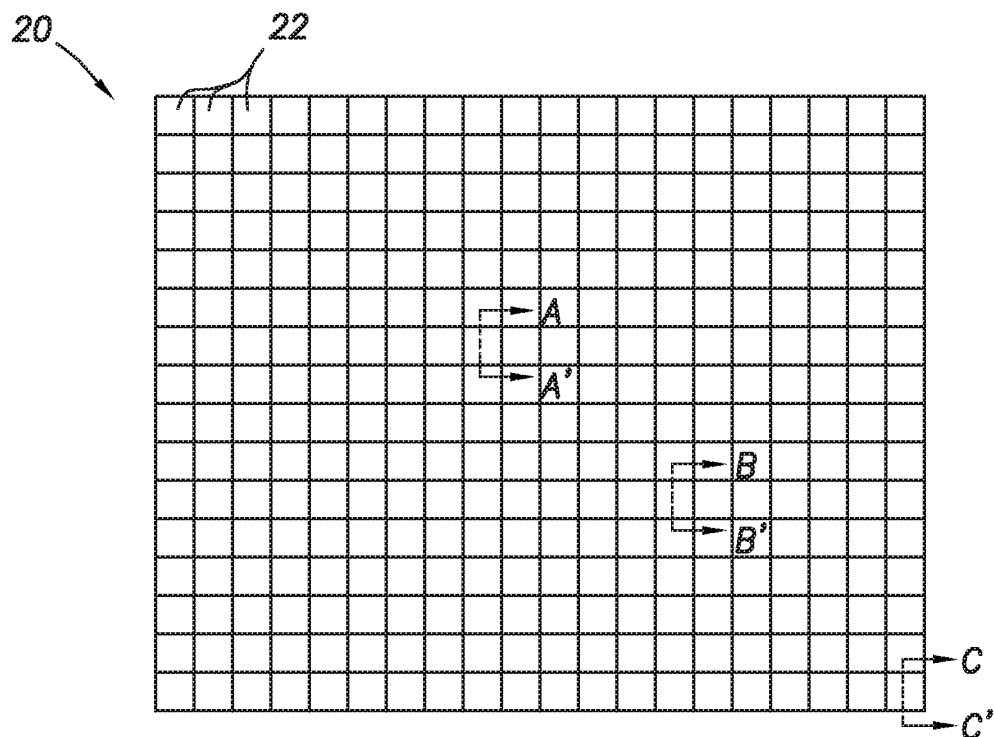
FIG. 5A is a top view of an illustrative image sensor with different color filter properties in different portions of the array in accordance with an embodiment of the present invention.
Figure 5B:
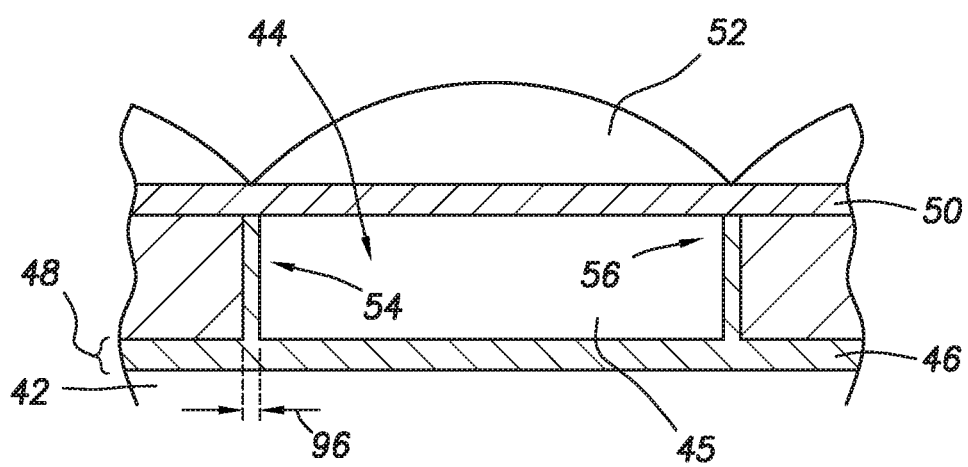
FIGS. 5B-5D are cross-sectional side views of different color filter elements in the image sensor of FIG. 5A with varying transparent sidewall widths in accordance with an embodiment of the present invention.
Figure 5C:
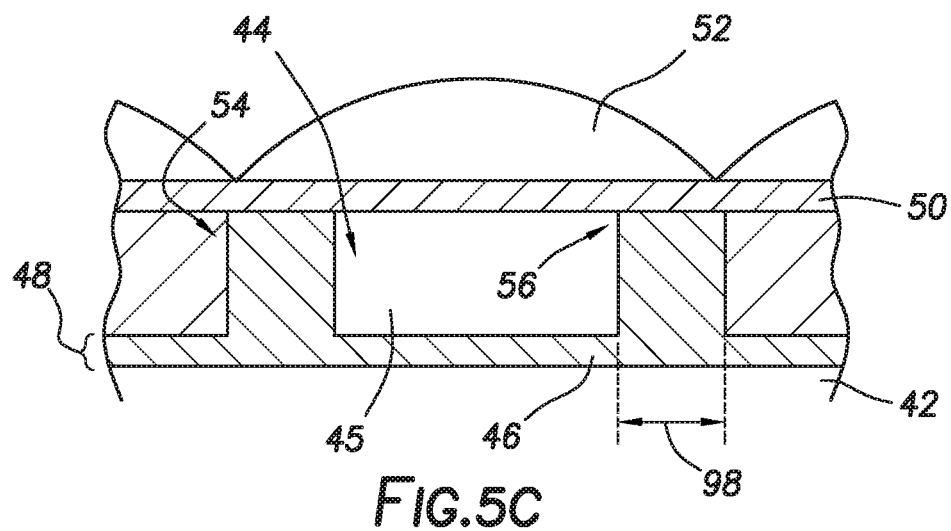
Figure 5D:
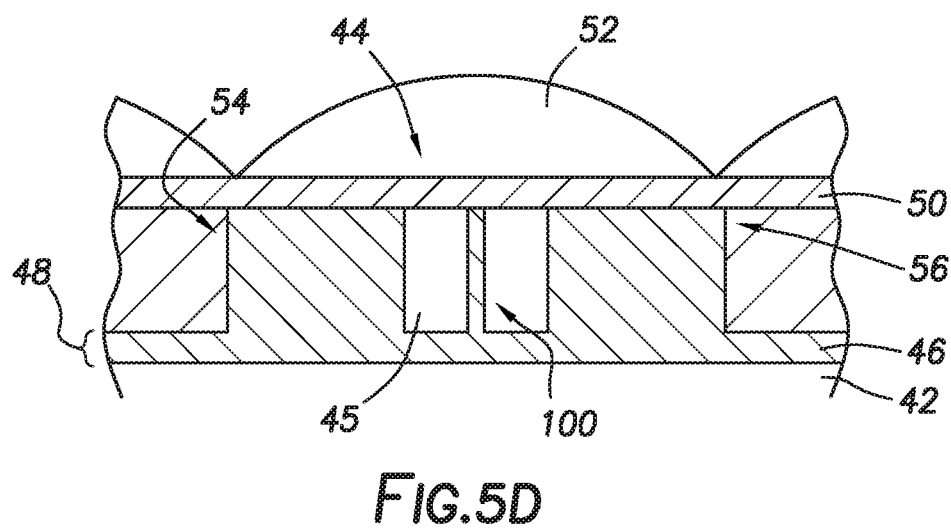

FIG. 5A is a top view of an illustrative image pixel array with different color filter properties in different portions of the array. In one illustrative example (as shown in FIGS. 5A-5D), the properties of the color filter elements may vary based on a distance from the center of the array. FIG. 5B is a cross-sectional side view along line AA' of FIG. 5A, FIG. 5C is a cross-sectional side view along line BB' of FIG. 5A, and FIG. 5D is a cross-sectional side view along line CC' of FIG. 5A. Similar to as discussed in connection with FIGS. 3B-3D, color filter elements may be formed on a substrate 42 that includes photosensitive areas. A respective color filter element 44 may cover each pixel, a passivation layer 46 may be interposed between the color filter elements and the substrate, a planarization layer 50 may be formed over color filter elements 44, and a microlens 52 may be formed over each pixel.

In FIG. 5B, the color filter element may 44 may be contained within dielectric material from passivation layer 46. This arrangement may sometimes be referred to as a color filter in a box (CIAB) arrangement. As shown in FIG. 5B, passivation layer 46 has a first portion 48 that extends across the entire array. Additionally, passivation layer 46 includes portions 54 and 56 that extend from an upper surface of portion 48 of passivation layer 46 to a lower surface of planarization layer 50. Portions 54 and 56 form sidewalls that contain color filter element 44.

In FIG. 5B, color filter element 44 is formed from color filter material 45 that is uninterrupted between portions 54 and 56 of passivation layer 46. However, color filter elements in different portions of array 20 may have a different structure. FIG. 5C shows the cross-sectional side view of a pixel that is further from the center of the array than the color filter element of FIG. 5B. The color filter material of this color filter element may have a smaller surface area on an upper surface due to increased thickness of sidewall portions 54 and 56. This may selectively alter the response to incident light of the color filter element. Portions 54 and 56 of passivation layer 46 may be transparent to a wider range of incident light than the surrounding color filter material.

As shown in FIG. 5C, color filter element 44 has portions 54 and 56 of passivation layer 46 to separate color filter element 44 from adjacent color filter elements (similar to as shown in FIG. 5B). However, in FIG. 5B portions 54 and 56 may have a width 96 whereas in FIG. 5C portions 54 and 56 may have a width 98. Width 98 may be larger than width 96. The increased width of portions 54 and 56 in FIG. 5C increases the amount of area in the pixel that is covered by portions 54 and 56 of passivation layer. Therefore, the amount of area of the pixel covered by color filter material 45 is decreased. This means that the pixel of FIG. 5C will have a different response to incident light than the pixel of FIG. 5B.

FIG. 5D shows the cross-sectional side view of a pixel that is even further from the center of the array than the color filter element of FIG. 5C. This color filter element may include additional transparent portions within the color filter element to further alter the response to incident light of the color filter element. As shown in FIG. 5D, color filter element 44 has portions 54 and 56 of passivation layer 46 to separate color filter element 44 from adjacent color filter elements (similar to as shown in FIGS. 5C). However, color filter element 44 may also include additional transparent portions formed by additional portion 100 of passivation layer 46. Portion 100 of passivation layer 46 extends from an upper surface of portion 48 of passivation layer 46 to a lower surface of planarization layer 50. Portion 100 of passivation layer does not have the same transmittance of incident light as color filter material 45. Therefore, the response of the pixel with the color filter element in FIG. 5D will be different than the pixel with the color filter element in FIG. 5C.

In FIGS. 5C and 5D, additional portions of passivation layers are included with similar structure to sidewalls 54 and 56 of FIG. 5B. This allows the additional transparent portions (i.e., the additional portions of sidewalls 54 and 56 due to the increased thickness in FIG. 5C and the additional portions of sidewalls 54 and 56 due to the increased thickness as well as additional portion 100 in FIG. 5D) to be formed in the same manufacturing step as sidewalls 54 and 56 of FIG. 5B. It should be noted that chemical mechanical planarization may be performed to ensure that the color filters of FIGS. 5B, 5C, and/or 5D have a planar upper surface.

Figure 6A:
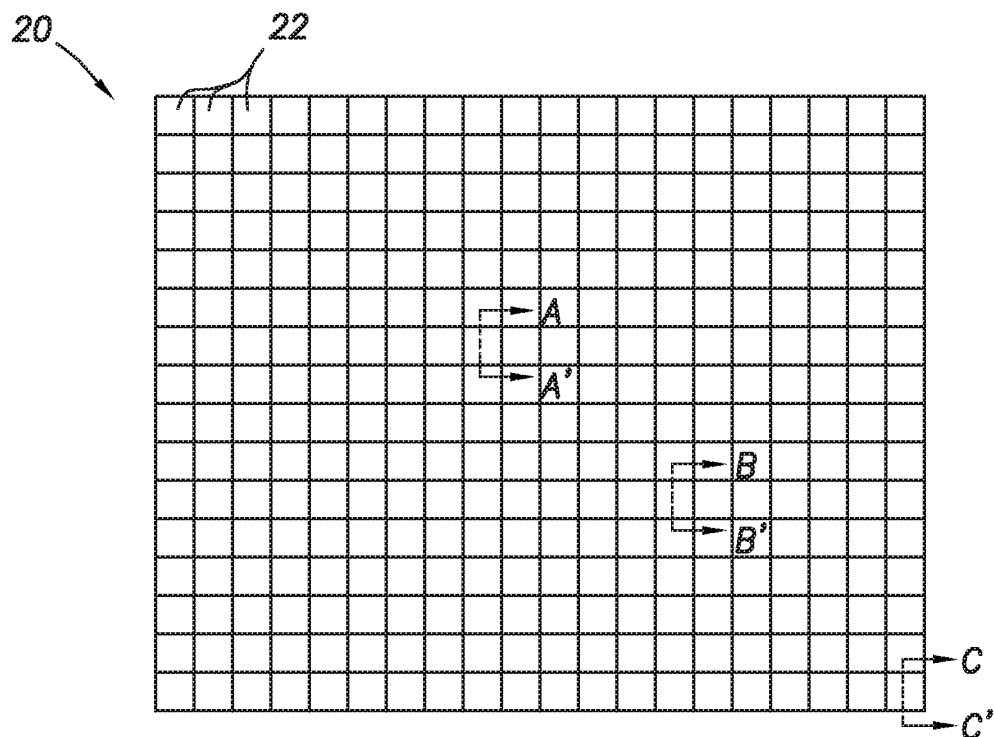
FIG. 6A is a top view of an illustrative image sensor with different color filter properties in different portions of the array in accordance with an embodiment of the present invention.
Figure 6B:
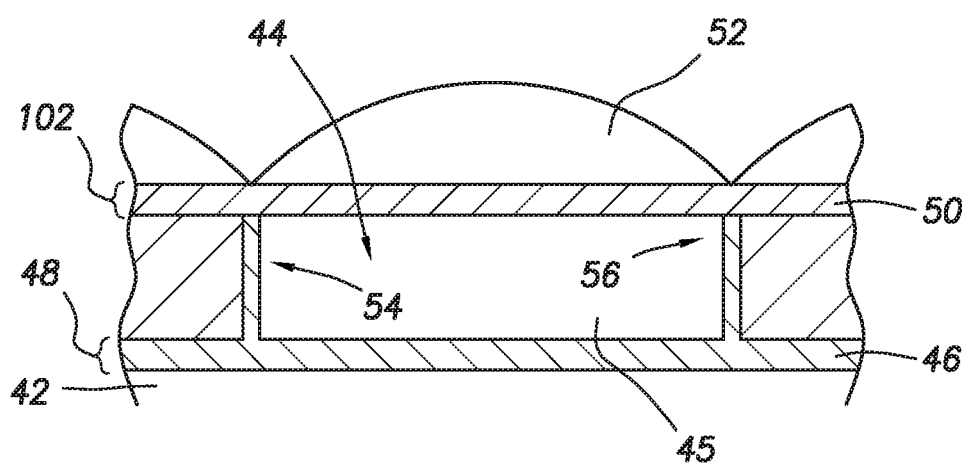
FIGS. 6B-6D are cross-sectional side views of different color filter elements in the image sensor of FIG. 6A with different amounts of transparent filler formed from a planarization layer in the color filter elements in accordance with an embodiment of the present invention.
Figure 6C:
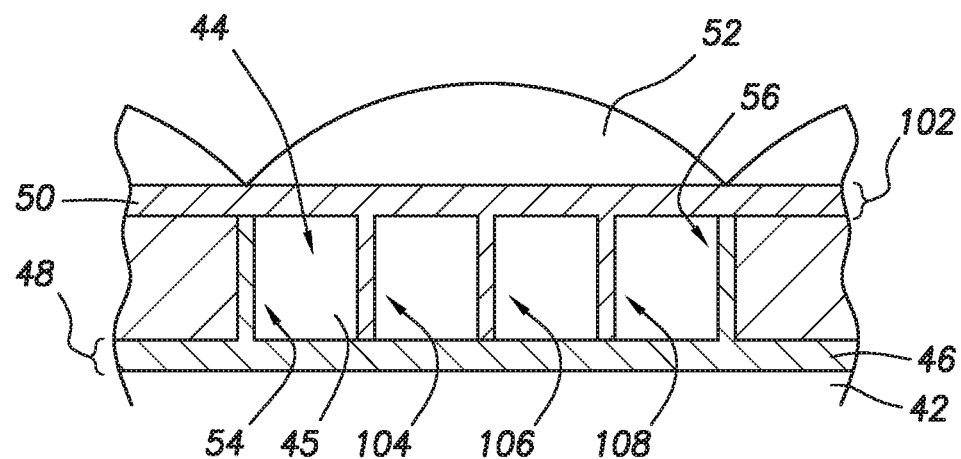
Figure 6D:
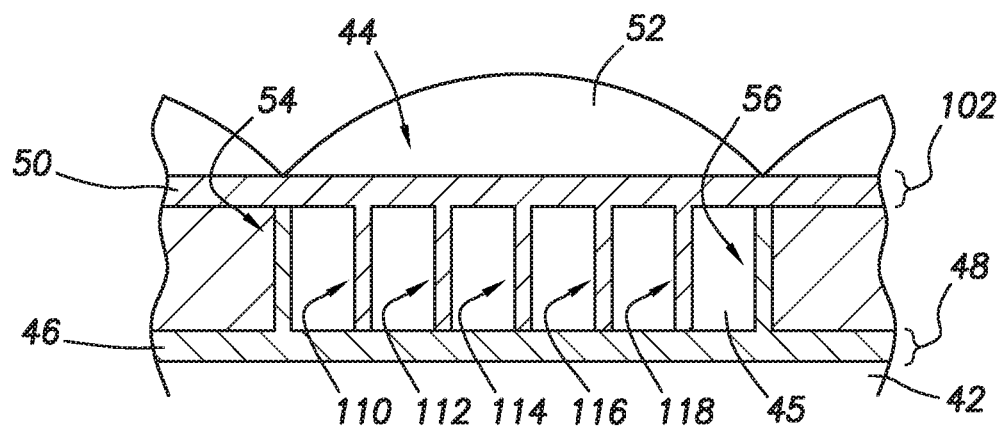

FIG. 6A is a top view of an illustrative image pixel array with different color filter properties in different portions of the array. In one illustrative example (as shown in FIGS. 6A-6D), the properties of the color filter elements may vary based on a distance from the center of the array. FIG. 6B is a cross-sectional side view along line AA' of FIG. 6A, FIG. 6C is a cross-sectional side view along line BB' of FIG. 6A, and FIG. 6D is a cross-sectional side view along line CC' of FIG. 6A. Similar to as discussed in connection with FIGS. 3B-3D, color filter elements may be formed on a substrate 42 that includes photosensitive areas. A respective color filter element 44 may cover each pixel, a passivation layer 46 may be interposed between the color filter elements and the substrate, a planarization layer 50 may be formed over color filter elements 44, and a microlens 52 may be formed over each pixel.

In FIG. 6B, the color filter element may 44 may be contained within dielectric material from passivation layer 46. This arrangement may sometimes be referred to as a color filter in a box (CIAB) arrangement. As shown in FIG. 6B, passivation layer 46 has a first portion 48 that extends across the entire array. Additionally, passivation layer 46 includes portions 54 and 56 that extend from an upper surface of portion 48 of passivation layer 46 to a lower surface of planarization layer 50. Portions 54 and 56 form sidewalls that contain color filter element 44.

In FIG. 6B, color filter element 44 is formed from color filtering material 45 that is uninterrupted between portions 54 and 56 of passivation layer 46. However, color filter elements in different portions of array 20 may have a different structure. FIG. 6C shows the cross-sectional side view of a pixel that is further from the center of the array than the color filter element of FIG. 6B. The color filter material of this color filter element may have a smaller surface area on an upper surface due to additional transparent portions formed between sidewalls 54 and 56. This may selectively alter the response to incident light of the color filter element. The additional portions of planarization layer between portions 54 and 56 of passivation layer 46 may be transparent to a wider range of incident light than the surrounding color filter material.

As shown in FIG. 6C, color filter element 44 has portions 54 and 56 of passivation layer 46 to separate color filter element 44 from adjacent color filter elements (similar to as shown in FIG. 6B). Planarization layer 50 may have a portion 102 that extends across the entire pixel array. Portion 102 of planarization layer 50 may be present in the pixels of both FIGS. 6B and 6C. However, in FIG. 6C planarization layer 50 may include additional portions 104, 106, and 108. Portions 104, 106, and 108 of planarization layer 50 may extend between a lower surface of portion 102 of planarization layer 50 and an upper surface of portion 48 of passivation layer 46.

In FIG. 6B, the color filtering material 45 (i.e., the material that filters light of a particular color) of color filter 44 extends across the entire pixel. In FIG. 6C, however, the color filtering material of color filter 44 is interrupted by portions 104, 106, and 108 of planarization layer 50. The portions 104, 106, and 108 of planarization layer 50 have a different transmittance of incident light than color filter material 45. For example, portions 104, 106, and 108 of planarization layer 50 may pass all visible light, all infrared light, and/or light at other wavelengths. Therefore, the response of the pixel to incident light with the color filter element in FIG. 6C will be different than the pixel with the color filter element in FIG. 6B.

FIG. 6D shows the cross-sectional side view of a pixel that is even further from the center of the array than the color filter element of FIG. 6C. This color filter element may include additional transparent portions within the color filter element to further alter the response to incident light of the color filter element. As shown in FIG. 6D, color filter element 44 has portions 54 and 56 of passivation layer 46 to separate color filter element 44 from adjacent color filter elements (similar to as shown in FIGS. 6B and 6C). However, color filter element 44 may also include additional transparent portions formed by additional portions 110, 112, 114, 116, and 118 of planarization layer 50. Portions 110, 112, 114, 116, and 118 of planarization layer 50 extend between an upper surface of portion 48 of passivation layer 46 to a lower surface of portion 102 of planarization layer 50. The portions 110, 112, 114, 116, and 118 of passivation layer have a different transmittance of incident light than color filter material 45. Therefore, the response of the pixel with the color filter element in FIG. 6D will be different than the pixel with the color filter element in FIG. 6C.

Figure 7A:
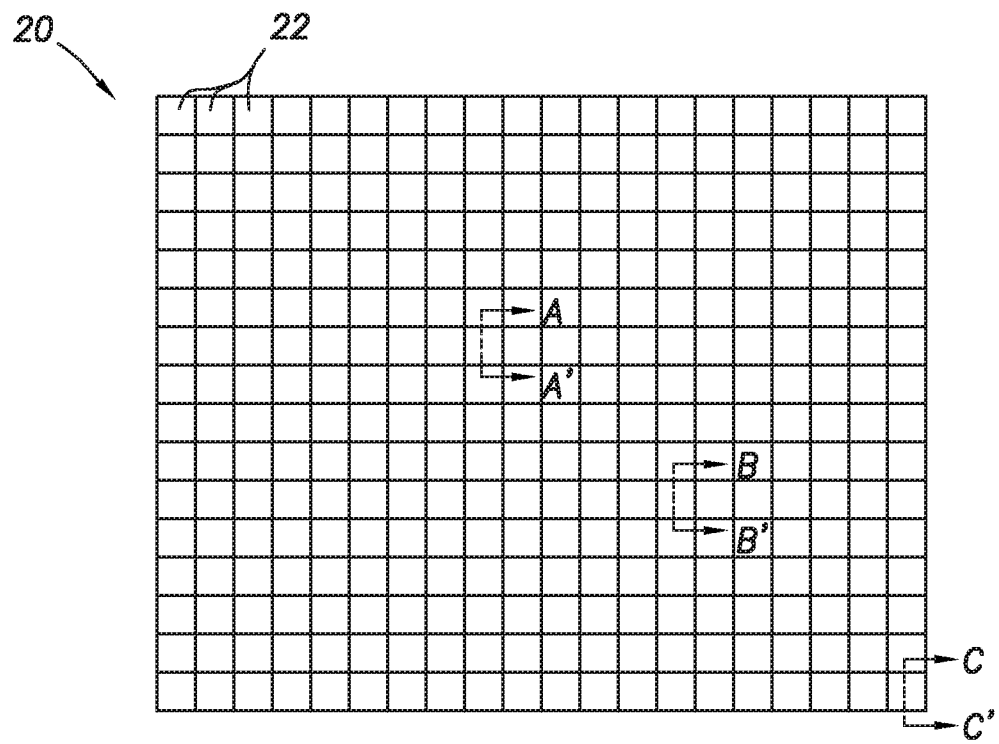
FIG. 7A is a top view of an illustrative image sensor with different color filter properties in different portions of the array in accordance with an embodiment of the present invention.
Figure 7B:
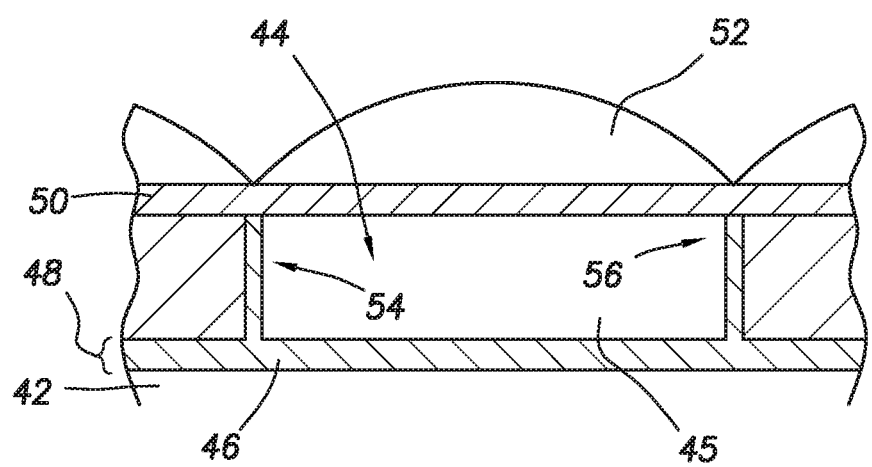
FIGS. 7B-7D are cross-sectional side views of different color filter elements in the image sensor of FIG. 7A with different amounts of gaps in the color filter elements in accordance with an embodiment of the present invention.
Figure 7C:
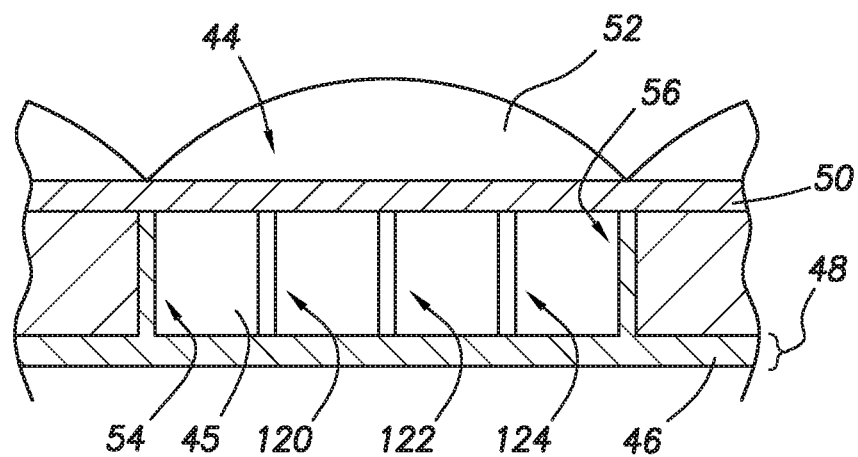
Figure 7D:
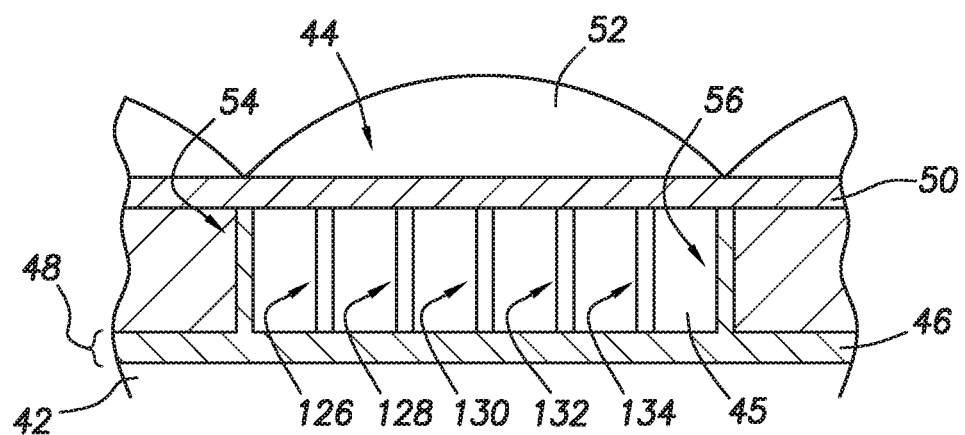

FIG. 7A is a top view of an illustrative image pixel array with different color filter properties in different portions of the array. In one illustrative example (as shown in FIGS. 7A-7D), the properties of the color filter elements may vary based on a distance from the center of the array. FIG. 7B is a cross-sectional side view along line AA' of FIG. 7A, FIG. 7C is a cross-sectional side view along line BB' of FIG. 7A, and FIG. 7D is a cross-sectional side view along line CC' of FIG. 7A. Similar to as discussed in connection with FIGS. 3B-3D, color filter elements may be formed on a substrate 42 that includes photosensitive areas. A respective color filter element 44 may cover each pixel, a passivation layer 46 may be interposed between the color filter elements and the substrate, a planarization layer 50 may be formed over color filter elements 44, and a microlens 52 may be formed over each pixel.

In FIG. 7B, the color filter element may 44 may be contained within dielectric material from passivation layer 46. This arrangement may sometimes be referred to as a color filter in a box (CIAB) arrangement. As shown in FIG. 7B, passivation layer 46 has a first portion 48 that extends across the entire array. Additionally, passivation layer 46 includes portions 54 and 56 that extend from an upper surface of portion 48 of passivation layer 46 to a lower surface of planarization layer 50. Portions 54 and 56 form sidewalls that contain color filter element 44.

In FIG. 7B, color filter element 44 is formed from color filter material 45 that is uninterrupted between portions 54 and 56 of passivation layer 46. However, color filter elements in different portions of array 20 may have a different structure. FIG. 7C shows the cross-sectional side view of a pixel that is further from the center of the array than the color filter element of FIG. 7B. The color filter material of this color filter element may have a smaller surface area on an upper surface due to gaps in color filter material 45 between sidewalls 54 and 56. This may selectively alter the response to incident light of the color filter element. The gaps in color filter material 45 between portions 54 and 56 of passivation layer 46 may be air-filled gaps transparent to a wider range of incident light than the surrounding color filter material.

As shown in FIG. 7C, color filter element 44 has portions 54 and 56 of passivation layer 46 to separate color filter element 44 from adjacent color filter elements (similar to as shown in FIG. 7B). In FIG. 7B color filter material 45 extends uninterrupted between portions 54 and 56 of passivation layer 46, whereas in FIG. 7C there are gaps such as gaps 120, 122, and 124 in the color filter material between portions 54 and 56 of passivation layer 46. Gaps 120, 122, and 124 may extend between a lower surface of planarization layer 50 and an upper surface of portion 48 of passivation layer 46. However, gaps 120, 122, and 124 may have smaller heights if desired. Gaps 120, 122, and 124 may transmit all incident light and therefore have a different transmittance of incident light than color filter material 45. Therefore, the response of the pixel to incident light with the color filter element in FIG. 7C will be different than the pixel with the color filter element in FIG. 7B.

FIG. 7D shows the cross-sectional side view of a pixel that is even further from the center of the array than the color filter element of FIG. 7C. This color filter element may include additional gaps within the color filter element to further alter the response to incident light of the color filter element. As shown in FIG. 7D, color filter element 44 has portions 54 and 56 of passivation layer 46 to separate color filter element 44 from adjacent color filter elements (similar to as shown in FIGS. 7B and 7C). However, color filter element 44 may also include additional gaps in color filter material 45 such as gaps 126, 128, 130, 132, and 134. Gaps 126, 128, 130, 132, and 134 may extend from an upper surface of portion 48 of passivation layer 46 to a lower surface of portion 102 of planarization layer 50. The gaps 126, 128, 130, 132, and 134 have a different transmittance of incident light than color filter material 45. Therefore, the response of the pixel with the color filter element in FIG. 7D will be different than the pixel with the color filter element in FIG. 7C. The gaps of FIGS. 7C and 7D may be filled with air.

In preceding embodiments of FIGS. 3A-3D, 5A-5D, 6A-6D, and 7A-7D, examples were shown where color filter element 44 is contained by dielectric material from passivation layer 46 in a color filter in a box (CIAB) arrangement. This example is merely illustrative, and in any of these embodiments the color filter in a box sidewalls (i.e., sidewalls 54 and 56) may optionally be removed. For example, in FIG. 3B sidewalls 54 and 56 may not be present and color filter element 44 may be directly adjacent to neighboring color filter elements. In FIGS. 3C and 3D, sidewalls 54 and 56 may not be present such that only passivation layer portions 48, 58 and 60 in FIG. 3C and passivation layer portions 48, 62, 64, 66, 68, and 70 in FIG. 3D are present.

FIGS. 3A-3D, 4A-4D, 5A-5D, 6A-6D, and 7A-7D show embodiments where color filter elements vary based on a distance from the center of the array. However, this example is merely illustrative. If desired, color filters may have varying characteristics in any desired pattern in the array.

FIGS. 8-11 are top views of illustrative pixel arrays showing different arrangements for varying color filter elements in the array. FIG. 8, 9, 10, or 11, may be considered to provide the AA', BB', and CC' cross-section lines for FIGS. 3B-3D, FIGS. 4B-4D, FIGS. 5B-5D, FIGS. 6B-6D, or FIGS. 7B-7D. For example, in FIG. 8 a color filter element along AA' may have a first structure (e.g., the structure of FIGS. 3B), a color filter element along BB' may have a second structure (e.g., the structure of FIGS. 3C), and a color filter element along CC' may have a third structure (e.g., the structure of FIG. 3D).

Figure 8:
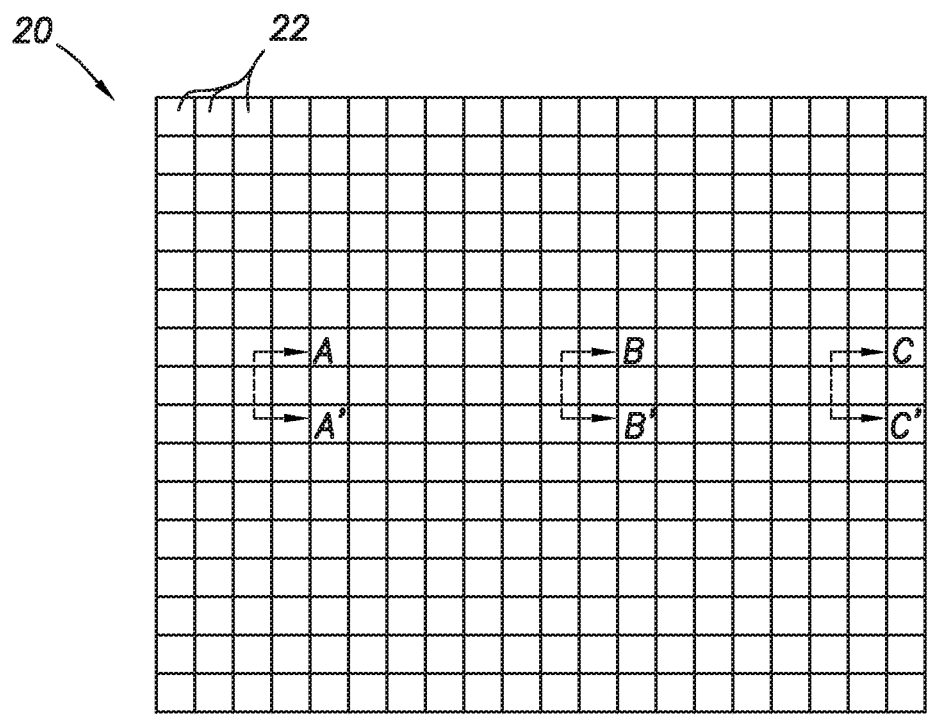
FIGS. 8-11 are top views of illustrative image sensors showing different ways in which color filter element properties can vary across a pixel array in accordance with an embodiment of the present invention.
Figure 9:
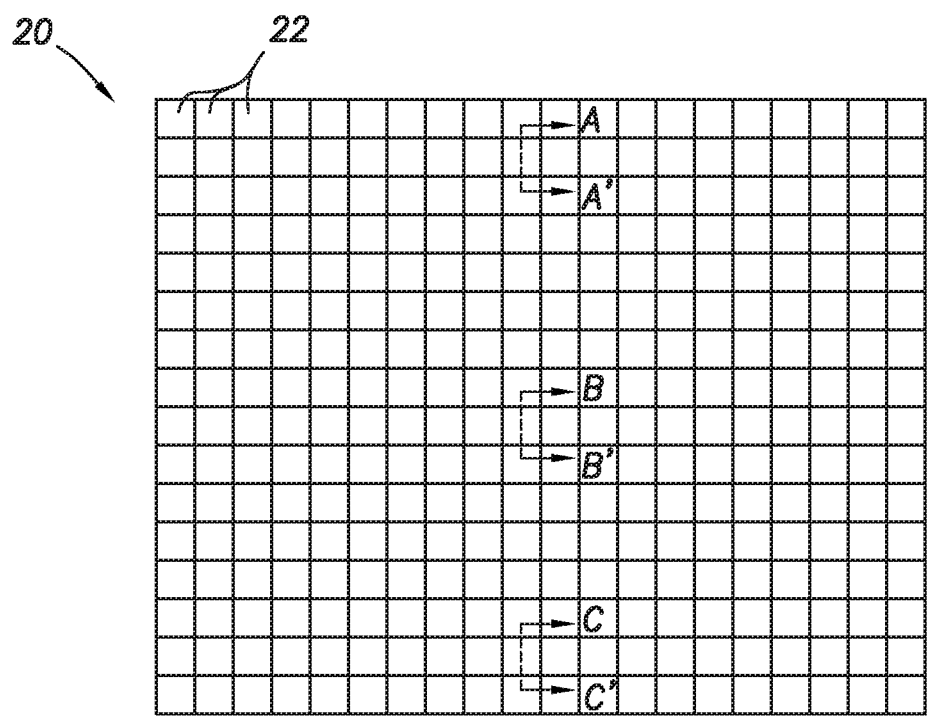
Figure 10:
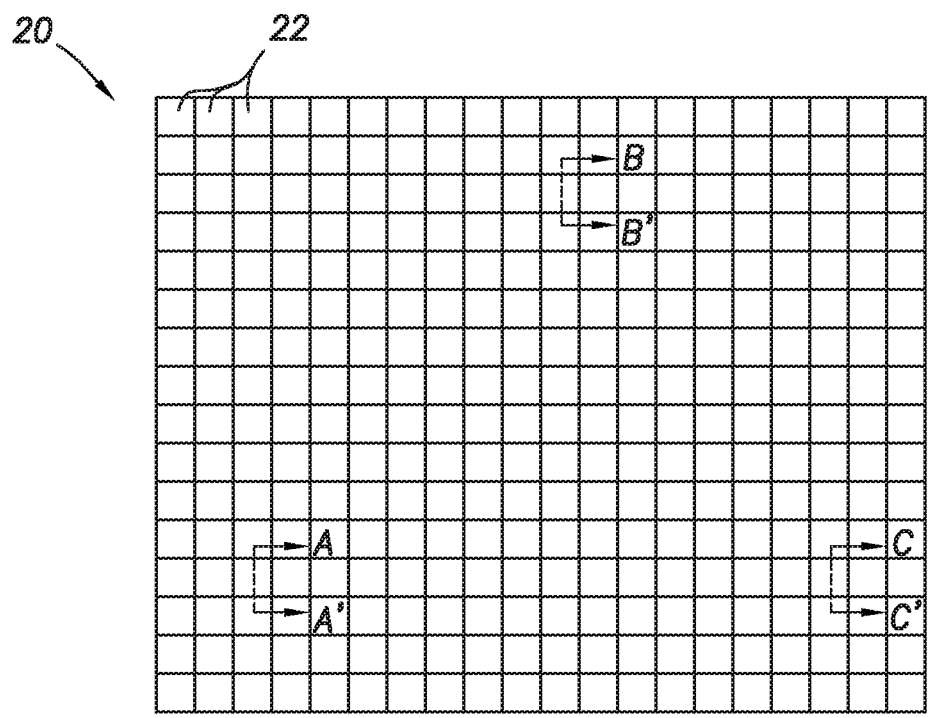
Figure 11:
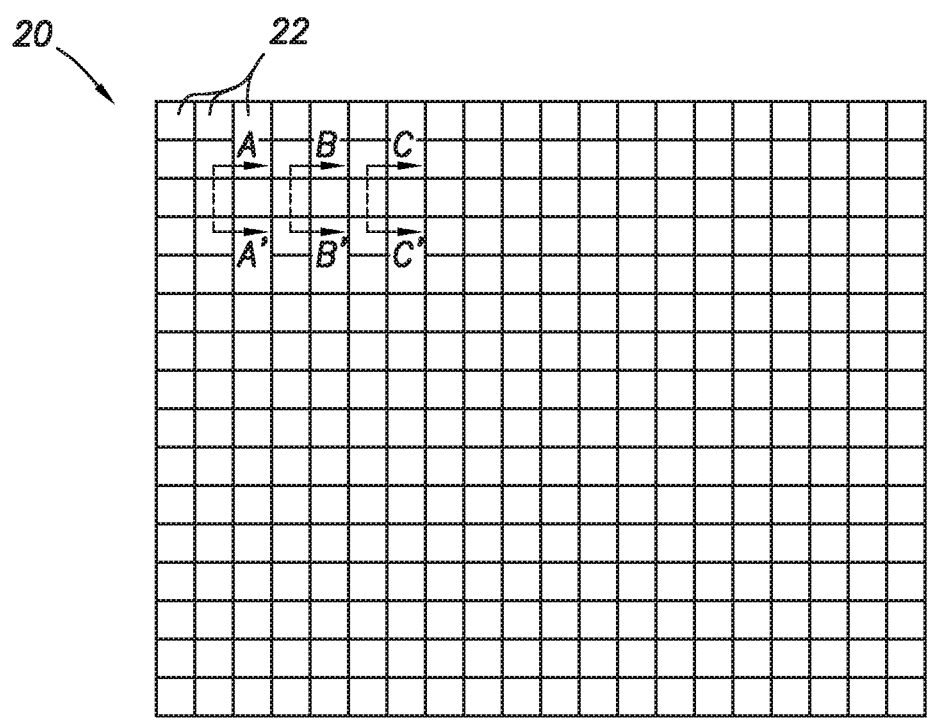

The color filter elements in FIG. 8 may vary depending on the column of the array (i.e., color filter elements from vary left to right across the array). The color filter elements in FIG. 9 may vary depending on the row of the array (i.e., color filter elements vary from top to bottom across the array). The color filter elements in FIG. 10 may vary depending upon the zone of the color filter element. For example, the array may have first, second, and third zones with corresponding color filter element structures. In FIG. 10, a first zone is formed in the lower left of the pixel array, a second zone is formed on the upper portion of the pixel array, and a third zone is formed in the lower right of the pixel array. FIG. 11 shows an example in which different color filter element structures are interspersed throughout the array. For example, as shown in FIG. 11 color filter elements of three different structures may be included throughout the array.

Numerous examples have been provided for how color filter elements may have different structures in a single pixel array. Importantly, color filter elements of the same color may have different structures in a single pixel array. For example, an image sensor may include a color filter array with a Bayer color filter pattern. However, color filters of the same color may vary depending on positioning within the array. For example, a green color filter element in the center of the pixel array may have a first structure such that the underlying pixel has a first response to incident light, a green color filter element between the center and edge of the pixel array may have a second structure such that the underlying pixel has a second response to incident light, and a green color filter element at the edge of the pixel array may have a third structure such that the underlying pixel has a third response to incident light. The first, second, and third structures may be different to produce different first, second, and third responses to incident light. The variations may be limited to color filter elements of one color or may be applied to color filter elements of multiple colors in the array. For example, in the aforementioned example the green color filter elements of a Bayer color filter pattern vary across the array. In this example, the red and blue color filter elements may also vary across the array or may not vary across the array. The red and blue color filter elements may vary with a different pattern than the green color filter elements if desired.

Changes between the structures of color filter elements may be gradual or may be in zones. For example, consider the example of FIGS. 3A-3D where additional transparent portions are included based on a distance between the color filter element and the center of the pixel array. If zones of color filter elements are present, the structures shown in FIGS. 3B-3D may be the only types of color filter elements present in the array. For example, there are two threshold distances from the center of the pixel array. If a pixel is within the first threshold, the color filter element may have the structure of FIG. 3B. If the pixel is between the first and second thresholds, the color filter element may have the structure of FIG. 3C. If the pixel is further from the center than the second threshold, the color filter element may have the structure of FIG. 3D. In contrast, there may be a more gradual change between color filter structures (i.e., the amount of additional transparent area in the color filter element may be proportional to a distance from the center of the pixel array).

The differences in color filter element structures of FIGS. 3B-3D, FIGS. 4B-4D, FIGS. 5B-5D, FIGS. 6B-6D, and FIGS. 7B-7D may all be based on variances in an upper surface area of color filter material in the color filter element. In FIGS. 3B-3D, FIGS. 4B-4D, FIGS. 5B-5D, FIGS. 6B-6D, and FIGS. 7B-7D, the additional structures that are included to change the response of the color filter elements are shown as having the same height as the surrounding color filter material. However, these examples are merely illustrative. In general, the additional structures within each color filter element (i.e., portions 58 and 60 in FIG. 3C, as one example) may have a height that is less than, equal to, or greater than the height of the surrounding color filter material.

Along these lines, the aforementioned embodiments where the upper surface area of the color filter material in the color filter element varies are merely illustrative. The differences in color filter element structures of FIGS. 3B-3D, FIGS. 4B-4D, FIGS. 5B-5D, FIGS. 6B-6D, and FIGS. 7B-7D may ultimately be based on variances in a volume of color filter material in the color filter element. In the pixel array, every pixel may have the same pixel width or pixel pitch (i.e., every pixel may have the same dimensions and be spaced the same amount). However, instead of the color filter elements having color filtering material with a uniform volume, the volume (and, sometimes, the surface area of the upper surface) of the color filtering material in the color filter elements may vary. The volume may be varied by incorporating additional structures into the color filtering material or widening existing sidewall structures in the color filter (i.e., additional transparent structures as in FIGS. 3A-3D, FIGS. 5A-5D, and FIGS. 6A-6D or additional opaque and/or transparent structures as in FIGS. 4A-4D). The volume may be varied by leaving gaps between color filtering material of the color filter element (i.e., FIGS. 7A-7D).

Figure 12A:
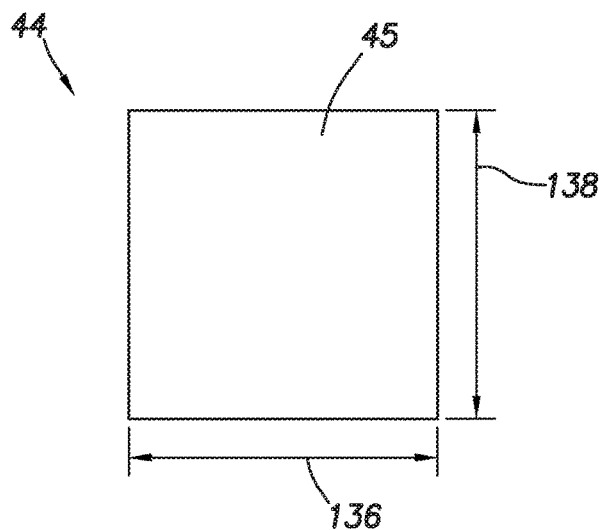
FIGS. 12A-12G are top views of illustrative color filter elements with varying amounts and patterns of non-filtering material in accordance with an embodiment of the present invention.
Figure 12B:
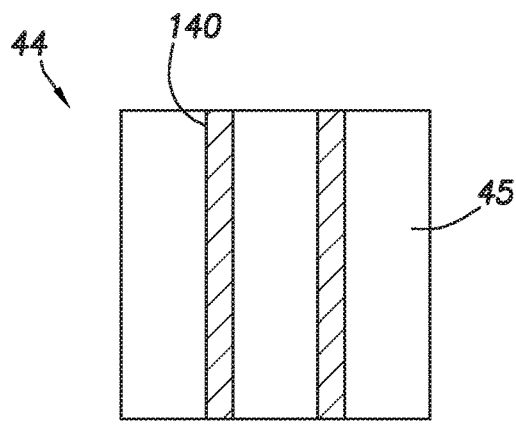

FIGS. 12A-12G are top views of illustrative color filter elements. FIG. 12A is a top view of an illustrative color filter element without additional structures to reduce surface area (i.e., similar to the color filter elements of FIGS. 3B, 4B, 5B, 6B, and 7B). As shown, color filter element 44 may have color filter material 45 with an upper surface that has a length 136 and a width 138. To vary the characteristics of the color filter element, other material may be incorporated into the color filter element that takes the place of color filter material 45. FIG. 12B shows other material (sometimes referred to as transparent material or non-filtering material) 140 arranged in vertical lines. The non-filtering material 140 may be formed by portions of a passivation layer (as in FIGS. 3C and 3D, for example), portions of a composite grid (as in FIGS. 4C and 4D, for example), portions of a planarization layer (as in FIGS. 6C and 6D, for example), gaps in the color filter material (as in FIGS. 7C and 7D), for example, or any other desired non-filtering material. In general, non-filtering material 140 may be any material different from color filter material 45.

Figure 12C:
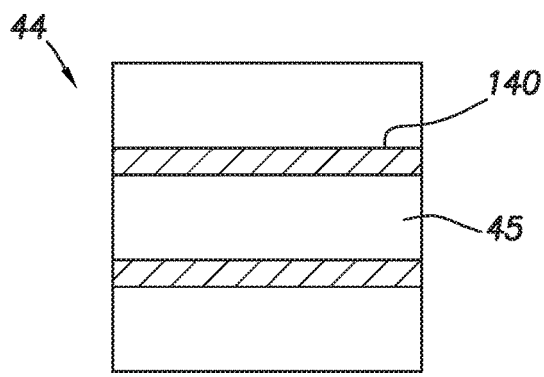
Figure 12D:
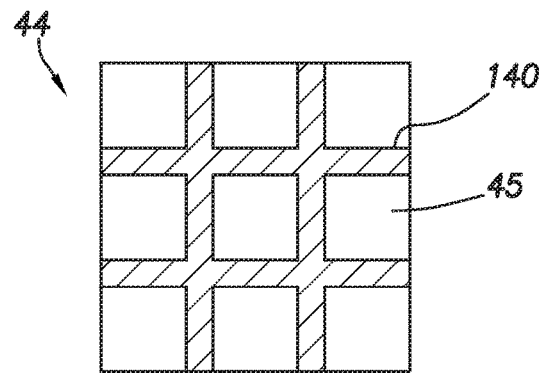
Figure 12E:
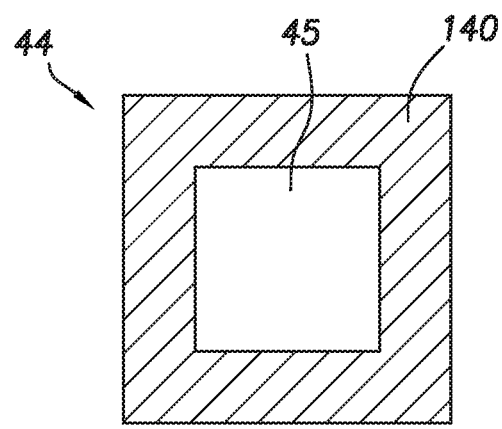
Figure 12F:
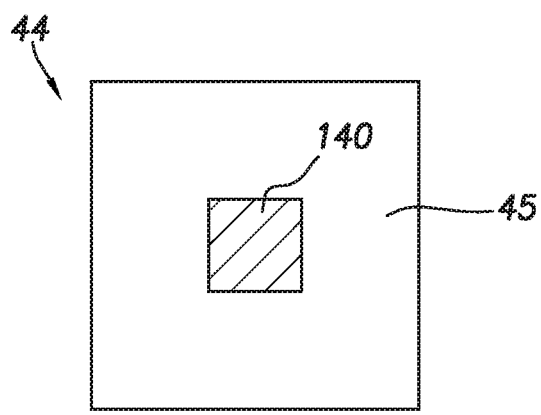
Figure 12G:
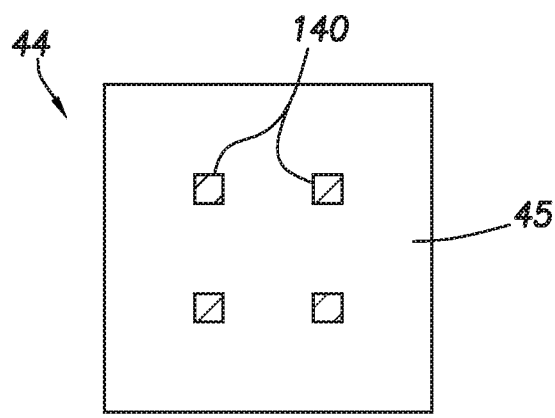

In FIG. 12B, the material 140 is arranged in vertical lines. However, the material 140 may instead be arranged in horizontal lines as shown in FIG. 12C. In another alternative shown in FIG. 12D, horizontal and vertical lines of material 140 may be included such that a mesh pattern is formed. In FIG. 12E, an embodiment is shown where material 140 is formed at the edges of the color filter element to reduce the length and/or width of the color filter element (similar to as discussed in connection with FIGS. 5C and 5D). FIG. 12F shows an embodiment where the material 140 is formed in the center of the color filter element. In other words, the material 140 does not need to extend across the entire color filter element (as in FIGS. 12B-12D). The material may be surrounded laterally by color filter material 45. Additionally, as shown in FIG. 12G, multiple isolated portions of material 140 may be included.

In general, material 140 may be formed in any desired pattern within color filter element 44. The examples of FIGS. 12F and 12G where portions of material 140 have a square cross-section are merely illustrative. Material 140 may have a circular cross-section, a rectangular cross-section, or a cross-section of any other desired shape. The different types of color filter elements may be formed in any desired location within the pixel array. The color filter elements may be designed and placed to support efficient light focusing as well.

In various embodiments, an image sensor may include an array of imaging pixels of a uniform size, the array of imaging pixels including a first imaging pixel and a second imaging pixel. The first imaging pixel may include a first photosensitive area covered by a first color filter element, and the first color filter element may include color filtering material that has a first volume. The second imaging pixel may include a second photosensitive area covered by a second color filter element, the second color filter element may include color filtering material that has a second volume, and the second volume may be less than the first volume.

Gaps may be formed between portions of the color filtering material of the second color filter element. The gaps may be filled with air. The image sensor may also include a layer with a first portion that extends over the first and second imaging pixels. The layer may be interposed between the first and second photosensitive areas and the first and second color filter elements. The gaps may be filled with additional portions of the layer. The image sensor may also include a first microlens formed over the first color filter element, a second microlens formed over the second color filter element, and a layer that has a first portion that extends over the first and second imaging pixels and is interposed between the first and second color filter elements and the first and second microlenses. The gaps may be filled with additional portions of the layer. The gaps may be filled by portions of a composite grid. The portions of the composite grid may include a metal layer and a dielectric layer. The image sensor may also include a third imaging pixel that includes a third photosensitive area covered by a third color filter element. The third color filter element may include color filtering material that has a third volume and the third volume may be less than the second volume. The color filtering material of the first color filter element, the color filtering material of the second color filter element, and the color filtering material of the third color filter element may all pass incident light of the same color.

In various embodiments, an image sensor may include a first imaging pixel that includes a first photosensitive area covered by a first color filter element and a second imaging pixel that includes a second photosensitive area covered by a second color filter element. The first color filter element may include color filtering material that passes incident light of a first color, the second color filter element may include color filtering material that passes incident light of the first color, and the second color filter element may include transparent filler that is interposed between portions of the color filtering material of the second color filter element.

The image sensor may also include a dielectric layer. The dielectric layer may have a first portion that extends across the first and second imaging pixels and may be interposed between the first and second photosensitive areas and the first and second color filter elements. The transparent filler may include additional portions of the dielectric layer. The image sensor may also include a first microlens formed over the first color filter element, a second microlens formed over the second color filter element, and a dielectric layer that has a first portion that extends over the first and second imaging pixels and is interposed between the first and second color filter elements and the first and second microlenses. The transparent filler may include additional portions of the dielectric layer. The image sensor may also include a third imaging pixel that includes a third photosensitive area covered by a third color filter element. The third color filter element may include color filtering material that passes incident light of the first color, the third color filter element may include transparent filler that is interposed between portions of the color filtering material of the third color filter element, and the third color filter element may have more transparent filler than the second color filter element.

In various embodiments, an image sensor may include an array of imaging pixels of a uniform size, the array of imaging pixels including a first imaging pixel and a second imaging pixel. The first imaging pixel may include a first photosensitive area covered by a first color filter element, the first color filter element may include color filtering material that passes incident light of a first color, the color filtering material of the first color filter element may be interposed between first sidewalls, the color filtering material of the first color filter element may extend continuously between the first sidewalls, the second imaging pixel may include a second photosensitive area covered by a second color filter element, the second color filter element may include color filtering material that passes incident light of the first color, the color filtering material of the second color filter element may be interposed between second sidewalls, and the color filtering material of the second color filter element may not extend continuously between the second sidewalls.

Transparent filler may be interposed between the second sidewalls to divide the color filtering material of the second color filter element into different portions. The transparent filler may be formed from the same material as the first sidewalls and the second sidewalls.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor comprising an array of imaging pixels, the array of imaging pixels comprising:
    an imaging pixel that includes a photosensitive area covered by a color filter element, wherein the color filter element comprises color filtering material that passes incident light of a first color, wherein at least one gap is formed between portions of the color filtering material of the color filter element, and wherein the at least one gap is filled with air.

2. The image sensor defined in claim 1, further comprising a layer with a first portion that extends over the photosensitive area.

3. The image sensor defined in claim 1, further comprising:
    a microlens formed over the color filter element; and
    a layer that has a first portion that is interposed between the color filter element and the microlens.

4. An image sensor comprising an array of imaging pixels, the array of imaging pixels comprising:
    an imaging pixel that includes a photosensitive area covered by a color filter element, wherein the color filter element comprises color filtering material that passes incident light of a first color and wherein at least one gap is formed between portions of the color filtering material of the color filter element;
    a microlens formed over the color filter element; and
    a layer that has a first portion that is interposed between the color filter element and the microlens, wherein the at least one gap is filled with at least one additional portion of the layer.

5. The image sensor defined in claim 1, wherein the at least one gap comprises a plurality of gaps.

6. An image sensor comprising:
    an imaging pixel that includes a photosensitive area covered by a color filter element, wherein the color filter element comprises color filtering material that passes incident light of a given color and wherein the color filter element comprises transparent filler that is interposed between portions of the color filtering material of the color filter element.

7. The image sensor defined in claim 6, further comprising a dielectric layer, wherein the dielectric layer has a first portion that extends across the imaging pixel.

8. The image sensor defined in claim 7, wherein the transparent filler comprises at least one additional portion of the dielectric layer.

9. The image sensor defined in claim 6 further comprising:
    a microlens formed over the color filter element; and
    a dielectric layer that has a first portion that is interposed between the color filter element and the microlens.

10. The image sensor defined in claim 9, wherein the transparent filler comprises at least one additional portion of the dielectric layer.

* * * * *